US011697612B2

(12) United States Patent
Yan et al.

(10) Patent No.: US 11,697,612 B2
(45) Date of Patent: Jul. 11, 2023

(54) LOW LOI TELLURIUM-LITHIUM-SILICON-ZIRCONIUM FRIT SYSTEM AND CONDUCTIVE PASTE AND APPLICATION THEREOF

(71) Applicant: Jiangsu Riyu Photovoltaic New Material Technology Co. Ltd, Wuxi (CN)

(72) Inventors: Li Yan, Wuxi (CN); Song Xu, Wuxi (CN); Rui Tian, Wuxi (CN)

(73) Assignee: JIANGSU RIYU PHOTOVOLTAIC NEW MATERIAL TECHNOLOGY CO. LTD, Wuxi (CN)

( * ) Notice: Subject to any disclaimer, the term of this patent is extended or adjusted under 35 U.S.C. 154(b) by 0 days.

(21) Appl. No.: 17/680,878

(22) Filed: Feb. 25, 2022

(65) Prior Publication Data

US 2022/0177356 A1    Jun. 9, 2022

Related U.S. Application Data

(63) Continuation of application No. 17/585,676, filed on Jan. 27, 2022, now abandoned.

(30) Foreign Application Priority Data

Jan. 6, 2022    (CN) .......................... 202210009639.0

(51) Int. Cl.
| | |
|---|---|
| *C03C 8/12* | (2006.01) |
| *C03C 8/10* | (2006.01) |
| *C03C 3/062* | (2006.01) |
| *H01L 31/0216* | (2014.01) |
| *C03C 3/07* | (2006.01) |
| *C03C 3/12* | (2006.01) |

(52) U.S. Cl.
CPC ................ *C03C 8/12* (2013.01); *C03C 3/062* (2013.01); *C03C 3/07* (2013.01); *C03C 3/122* (2013.01); *C03C 8/10* (2013.01); *H01L 31/02167* (2013.01)

(58) Field of Classification Search
CPC ........... C03C 3/062; C03C 3/07; C03C 3/102; C03C 3/122; C03C 4/14; C03C 8/02; C03C 8/10; C03C 8/12; C03C 8/16; C03C 8/18; C03C 8/20
See application file for complete search history.

(56) References Cited

U.S. PATENT DOCUMENTS

| | | | |
|---|---|---|---|
| 8,900,488 B2* | 12/2014 | Li | H01B 1/02 252/514 |
| 2009/0189126 A1* | 7/2009 | Prunchak | C03C 8/02 501/24 |
| 2011/0308596 A1* | 12/2011 | Carroll | B22F 1/105 252/514 |
| 2011/0308597 A1* | 12/2011 | Carroll | H01B 1/22 252/514 |
| 2013/0049148 A1* | 2/2013 | Hang | C04B 35/01 252/514 |
| 2013/0186463 A1* | 7/2013 | Wang | C03C 8/18 252/514 |
| 2013/0217560 A1* | 8/2013 | Antonini | C03C 8/04 501/15 |
| 2013/0255768 A1* | 10/2013 | Carroll | H01L 31/0264 252/514 |
| 2013/0255769 A1* | 10/2013 | Carroll | H01B 1/22 252/514 |
| 2013/0255770 A1* | 10/2013 | Carroll | B22F 7/04 252/514 |
| 2020/0331796 A1* | 10/2020 | Kim | H01L 31/022425 |

\* cited by examiner

*Primary Examiner* — Elizabeth A. Bolden
(74) *Attorney, Agent, or Firm* — IPRO, PLLC

(57) ABSTRACT

The present disclosure discloses a low LOI tellurium-lithium-silicon-zirconium frit system and a conductive paste and application thereof, and belongs to the field of conductive paste. In the low LOI tellurium-lithium-silicon-zirconium frit system, components of the frit are 24%-40% $TeO_2$, 18%-24% $Li_2O$, 4%-13% $SiO_2$, 0-2% $ZrO_2$, and a balance $MO_x$, and M is one or a mixture of Na, K, Mg, Ca, Sr, Ti, V, Cr, Mo, W, Mn, Cu, Ag, Zn, Cd, B, Al, Ga, Tl, Ge, Pb, P, and Bi. There is no need to add additional surfactants, a viscosity change of the conductive paste prepared after standing for 30 days is less than 20%, the conductive paste has good stability, the water related weight loss of inorganic oxide of the conductive paste is less than 1.6%, and the application performance of the conductive paste is not affected after standing for 30 days.

3 Claims, No Drawings

LOW LOI TELLURIUM-LITHIUM-SILICON-ZIRCONIUM FRIT SYSTEM AND CONDUCTIVE PASTE AND APPLICATION THEREOF

TECHNICAL FIELD

The present disclosure relates to a conductive paste for printing on a surface of photovoltaic solar cell equipment having one or more passivation layers, particularly relates to a low LOI (Loss on Ignition) tellurium-lithium-silicon-zirconium frit system and a conductive paste and application thereof, the conductive paste including a conductive metal, an organic vehicle, and a tellurium-lithium-silicon-zirconium oxide, and belongs to the field of conductive paste.

BACKGROUND

A substrate of a conventional P-type (or N-type) solar cell is of a P-type (or N-type) structure. When sunlight irradiates a P-type or N-type cell, a front side of the P-type cell is a negative electrode and a back side of the P-type cell is a positive electrode, while a back side of the N-type cell is a negative electrode and a front side of the N-type cell is a positive electrode. When photons are incident on a p-n junction of a semiconductor, electron-hole pair carriers are excited to be generated. These electron-hole pair carriers migrate under an electric field generated by the p-n junction and are collected by an electrode network on a cell surface and flow to an external circuit. Most solar cells have one or more passivation layers on a surface of a silicon wafer. The passivation layer on the surface of the silicon wafer is coated with the conductive paste by screen printing, after the conductive paste is fired, the passivation layer is penetrated through, conductive electrodes are formed on the solar cell surface, and the silicon wafer and the surface electrode network of the cell are conducted.

When the conductive paste is prepared, metal, an inorganic oxide and a vehicle are firstly weighed in a proportion of a formula, raw materials of the conductive paste are stirred and mixed uniformly with a mixer, then the conductive paste is repeatedly mixed using a three-roller mill, and then it is only needed that the conductive paste is further mixed uniformly using a shearing force between rollers of the three-roller mill. The conductive paste is generally stored and transported for three months to six months before the conductive paste can be printed and applied to the silicon wafer. A viscosity value of the conductive paste is an important parameter to ensure successful printing of the conductive paste. The conductive paste needs to keep a stable viscosity value during storage and transportation. If viscosity increases, the conductive paste may cause blurred printing of metal electrodes, broken lines, or height fluctuation of the paste during printing. Thus, the photoelectric conversion efficiency of the solar cell is reduced. If the viscosity is lowered, the conductive paste causes widening and height reduction of the metal electrode during printing, and also reduces the photoelectric conversion efficiency of solar energy.

The inorganic oxide in the conductive paste generally consists of network formers and network modifiers. The network formers are exemplified by silicon oxide and tellurium oxide. Silicon and silicon are linked together by bridging oxygen and tellurium and tellurium are linked together by bridging oxygen, and structural formulae are $\equiv$Si—O—Si$\equiv$ and $\equiv$Te—O—Te$\equiv$. On the surface of the inorganic oxide, a network structure is broken and there are two cases for outermost atoms, one is O and one is Si (or Te), and $\equiv$Si—O$^-$+$\equiv$Si$^+$, or $\equiv$Te—O$^-$+=Te$^+$ is formed. During processing or storage of the inorganic oxide, the inorganic oxide may be exposed to water, or water vapor in the air. $H_2O$ decomposes to $H^+$+$OH^-$ to be combined with atoms on the surface of the inorganic oxide, and the following process occurs: $\equiv$Si—O$^-$H$^+$$\rightarrow$$\equiv$Si—OH, $\equiv$Si$^+$+OH$^-$$\rightarrow$Si—OH, $\equiv$Te—O$^-$+H$^+$$\rightarrow$$\equiv$Te—OH, and $\equiv$Te$^+$+OH$^-$$\rightarrow$$\equiv$Te—OH, thus resulting in that the surface of the inorganic oxide is covered with a layer of hydroxyl groups.

The network modifier of the inorganic oxide in the conductive paste includes alkali metals, alkaline earth metals and other elements. Taking $Na_2O$ as an example, the $Na_2O$ exists as $Na^+$ free outside the network. Likewise, during processing or storage of the inorganic oxide, if the inorganic oxide is exposed to water or water vapor in the air, $Na^+$ is displaced by W ions in the water vapor on the surface of the inorganic oxide, that is, $\equiv$Si—O—Na+$H_2O$$\rightarrow$$\equiv$Si—O—H+NaOH. NaOH produced further reacts with $CO_2$ in the air to generate $Na_2CO_3$ and $H_2O$. NaOH and $Na_2CO_3$ will further hydrate with $H_2O$ to form $NaOH \cdot (H_2O)_m$ and $Na_2CO_3 \cdot (H_2O)_n$, where m may be 1 and n may be 1, 1.5, 2, 4, 6, 7, and 10. Similarly, alkali metals Li and K, and other metal oxides also will form various hydrated oxides in the same way. In addition, an exterior of the inorganic oxide may be coated with $H_2O$ in other forms other than a hydrate. In the paste, $H_2O$ in various forms increases activity of alkali metal ions, thereby affecting stability of an inorganic system and a viscosity change of the paste.

In order to achieve long-term storage stability of the paste, so as to ensure good ink passing performance of the paste during printing, and ensure that there is no blurred printing and broken lines after printing, several specific dispersants and a method of preferring an organic solvent and resin are added in the patent publication CN113362983A. These dispersants can promote a better dispersion effect of powder in the conductive paste, thus better balancing properties of various components in the paste and enabling the components to exert better efficacy. Thus, the paste has good long-term storage stability.

However, how to maintain long-term storage stability of the conductive paste without adding other dispersants remains a challenge to a certain extent. Especially in a high temperature and low temperature environment during transportation, the viscosity change of the paste is more accelerated. The long-term stable paste viscosity can ensure stable printing effect of the paste and make the solar cell achieve the best photoelectric conversion efficiency.

SUMMARY

In order to improve the long-term storage stability of a conductive paste, the present disclosure provides a preparation method of a low LOI tellurium-lithium-silicon-zirconium conductive paste, and a low LOI tellurium-lithium-silicon-zirconium system conductive paste, the conductive paste prepared by the present disclosure has a viscosity change of <20% after standing for 30 days, and has good stability, the water weight loss of inorganic oxide of the conductive paste is less than 1.6%, even less than 1.4%, and the application performance of the conductive paste is not affected after standing for 30 days.

In order to achieve the above-mentioned purposes, the present disclosure firstly provides a low LOI tellurium-lithium-silicon-zirconium frit system, and components of the frit are:

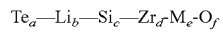                    (I)

where, $0<a<0.8$, $0<b<0.5$, $0.01<c<0.4$, $0<d<0.1$, $0<e<(1-(a+b+c+d))$, and f is a number such that an amount of oxygen (O) is balanced for the mixture, and M is one or a mixture of Na, K, Mg, Ca, Sr, Ti, V, Cr, Mo, W, Mn, Cu, Ag, Zn, Cd, B, Al, Ga, Tl, Ge, Pb, P, and Bi.

In one embodiment of the present disclosure, the frit, calculated as oxide, in mol %, includes 24%-40% $TeO_2$, 18%-24% $Li_2O$, 4%-13% $SiO_2$, 0-2% $ZrO_2$, and a balance $MO_x$, where $MO_x$ is one or a mixture of $Na_2O$, $K_2O$, MgO, CaO, SrO, $TiO_2$, $V_2O_5$, $Cr_2O_3$, $MoO_3$, $WO_3$, MnO, CuO, $Ag_2O$, ZnO, CdO, $B_2O_3$, $Al_2O_3$, $Ga_2O_3$, $Tl_2O_3$, $GeO_2$, PbO, $P_2O_5$, and $Bi_2O_3$.

In one embodiment of the present disclosure, the frit, calculated as oxide, in mol %, includes 28%-40% $TeO_2$, 18%-20% $Li_2O$, 12%-13% $SiO_2$, 0.2%-2% $ZrO_2$, and a balance $MO_x$, where $MO_x$ is one or a mixture of $Na_2O$, $K_2O$, MgO, CaO, SrO, $TiO_2$, $V_2O_5$, $Cr_2O_3$, $MoO_3$, $WO_3$, MnO, CuO, $Ag_2O$, ZnO, CdO, $B_2O_3$, $Al_2O_3$, $Ga_2O_3$, $Tl_2O_3$, $GeO_2$, PbO, $P_2O_5$, and $Bi_2O_3$.

In one embodiment of the present disclosure, the frit, calculated as oxide, in mol %, includes 40% $TeO_2$, 20% $Li_2O$, 12% $SiO_2$, 0.2% $ZrO_2$, and 27.8% $MO_x$, where $MO_x$ is one or a mixture of $Na_2O$, $K_2O$, MgO, CaO, SrO, $TiO_2$, $V_2O_5$, $Cr_2O_3$, $MoO_3$, $WO_3$, MnO, CuO, $Ag_2O$, ZnO, CdO, $B_2O_3$, $Al_2O_3$, $Ga_2O_3$, $Tl_2O_3$, $GeO_2$, PbO, $P_2O_5$, and $Bi_2O_3$.

In one embodiment of the present disclosure, the frit, calculated as oxide, in mol %, includes 28% $TeO_2$, 18% $Li_2O$, 13% $SiO_2$, 0.5% $ZrO_2$, and 41% $MO_x$, where $MO_x$ is one or a mixture of $Na_2O$, $K_2O$, MgO, CaO, SrO, $TiO_2$, $V_2O_5$, $Cr_2O_3$, $MoO_3$, $WO_3$, MnO, CuO, $Ag_2O$, ZnO, CdO, $B_2O_3$, $Al_2O_3$, $Ga_2O_3$, $Tl_2O_3$, $GeO_2$, PbO, $P_2O_5$, and $Bi_2O_3$.

In one embodiment of the present disclosure, the frit, calculated as oxide, in mol %, includes 40% $TeO_2$, 20% $Li_2O$, 12% $SiO_2$, 2% $ZrO_2$, and 26% $MO_x$, where $MO_x$ is one or a mixture of $Na_2O$, $K_2O$, MgO, CaO, SrO, $TiO_2$, $V_2O_5$, $Cr_2O_3$, $MoO_3$, $WO_3$, MnO, CuO, $Ag_2O$, ZnO, CdO, $B_2O_3$, $Al_2O_3$, $Ga_2O_3$, $Tl_2O_3$, $GeO_2$, PbO, $P_2O_5$, and $Bi_2O_3$.

The present disclosure further provides a low LOI conductive paste, including 84-94% of a conductive metal, 0.1-9% of the above-mentioned low LOI tellurium-lithium-silicon-zirconium frit system, and 5-15% of an organic vehicle, based on weight of the conductive paste.

In one embodiment of the present disclosure, the conductive metal is any one or several of silver, gold, platinum, rhodium, copper, nickel, and aluminum.

In one embodiment of the present disclosure, the conductive metal is preferentially silver.

In one embodiment of the present disclosure, the organic vehicle is preferentially a solution, emulsion or dispersion of the organic vehicle based on one or more solvents, and ensures that the components of the conductive paste are present in dissolved, emulsified or dispersed forms. Preferentially, the organic vehicle is those substances that provide optimal component stability in the conductive paste and impart viscosity to the conductive paste to allow effective row printability.

In one embodiment of the present disclosure, the organic vehicle includes an organic binder, an organic solvent, a thixotropic agent and a surfactant.

In one embodiment of the present disclosure, the organic binder is selected from one or more of ethyl cellulose, polyacrylic acid, phenolic resin, polyvinyl butyral, polyethylene resin, polyurethane resin, polyester resin, polycarbonate, rosin derivatives, and any combination thereof; the organic solvent is selected from one of carbitol, terpineol, hexyl carbitol, butyl carbitol acetate, dimethyl adipate, butyl carbitol, or any combination thereof, and the like; the thixotropic agent is selected from one of castor oil derivatives, polyamide, polyamide derivatives, pyrolysis method dioxide silicon, carboxylic acid derivatives, fatty acid derivatives, or any combination thereof, and the like; and the surfactant is selected from one of polyethylene oxide, benzotriazole, polyethylene glycol, tallow diamine dioleate, organic silicone oil, poly(ethylene glycol) acetic acid, linoleic acid, stearic acid, lauric acid, oleic acid, capric acid, myristic acid, palmitic acid, stearate, palmitate, or any combination thereof.

In one embodiment of the present disclosure, the weight of the low LOI tellurium-lithium-silicon-zirconium frit system is 0.5-5% of the conductive paste.

The present disclosure further provides a preparation method of the above-mentioned conductive paste. The method includes: mixing the organic vehicle uniformly, then adding glass powder and conductive metal powder to the organic vehicle, stirring sufficiently to form a mixture, repeatedly rolling the paste composition with a three-roller grinder, and forming the conductive paste by grinding.

The present disclosure further provides a solar cell device, and the solar cell device includes the above-mentioned low LOI tellurium-lithium-silicon-zirconium frit system or the above-mentioned low LOI conductive paste.

The present disclosure further provides application of the above-mentioned low LOI tellurium-lithium-silicon-zirconium frit system or the above-mentioned low LOI conductive paste in the field of solar energy utilization.

The present disclosure further has the following advantages and effects compared with the prior art:

In the present disclosure, various forms of water on the surface of the inorganic oxide are found, include hydrates, hydroxyl groups and other forms of water, and affect the long-term stability of the conductive paste. Therefore, the present disclosure reduces the water on the surface of the inorganic oxide in the following means. Firstly, various forms of water on the surface of the inorganic oxide are controlled to be <1.6% by weight through compounding. Secondly, $SiO_2$ and $ZrO_2$ contents of the inorganic oxide are increased, $1%<SiO_2<40%$, and $0%<ZrO_2<10%$. A high $SiO_2$ content and a proper $ZrO_2$ content help to effectively reduce the water on the surface of the inorganic oxide.

In the present disclosure, there is no need to add additional surfactants. Excessive surfactants will significantly reduce the viscosity of the paste, and will cause finger lines to expand during printing, thereby increasing a shading area and reducing the photoelectric conversion efficiency. The present disclosure avoids introduction of excessive surfactants, thereby ensuring good printing performance and photoelectric conversion efficiency.

DETAILED DESCRIPTION

The present disclosure will be further described below with reference to examples, but embodiments of the present disclosure are not limited thereto.

In order to improve viscosity stability of a conductive paste during storage and transportation, in the present disclosure, it has been found that viscosity of the conductive paste is unstable after the conductive paste is prepared using an inorganic oxide raw material having a large amount of hydrates, hydroxyl groups (—OH) or other forms of $H_2O$ on the surface thereof, and the viscosity of the conductive paste changes greatly with a change of storage time, ambient temperature and humidity. Therefore, it is needed to reduce the hydrates, hydroxyl groups, and other forms of water on the surface of the inorganic oxide. Specific test methods are as follows.

A water vapor weight loss of the inorganic oxide is tested by using TGA-IR equipment. A sample is placed in the TGA-IR equipment and heated from room temperature to 500° C. under a nitrogen environment. TGA is used to test a weight change of the sample, IR is used to test an infrared spectrum of excluded gas, and it is determined that the weight change of the sample is due to water vapor generated by evaporation, decomposition or reaction on a surface of the sample. The water vapor weight loss needs to be controlled within 1.6%.

An experimental method is as follows:

(1) Inorganic oxide: metal oxides are mixed in a certain ratio, a mixed composition is melted at about 900-1300° C. and then quenched to about 25° C., and then an obtained material is pulverized using a planetary mill and dried, thereby obtaining uniform inorganic oxide powder (frit).

(2) Conductive paste: an organic vehicle such as an organic binder, an organic auxiliary, and an organic solvent is mixed and stirred at 50-60° C. with a high shearing force for 1-2 hours. The inorganic oxide powder obtained in step (1) and silver powder are added into the above-mentioned mixture, sufficient stirring is performed to form a mixture, repeated rolling is carried on the paste composition with a three-roll mill, and the conductive paste is formed by milling.

(3) Viscosity testing: a viscosity value of the conductive paste is measured using a Brookfield DV1 viscosity tester and a rotor SC-14 at 25° C.

(4) Photoelectric conversion efficiency testing: the conductive paste is printed onto a silicon wafer substrate by a screen-printing technique. Cell sheets are dried in an infrared drying oven and then sintered at 750-850° C. in a belt type firing furnace. Cooling is performed after sintering, and cells are formed. The photoelectric conversion efficiency of the cells is tested with an IV tester.

Example 1

Different metal oxides were mixed in a certain ratio according to a formula of Table 1, a mixed composition was melted at about 900-1300° C. and then quenched to about 25° C., and then an obtained material was pulverized using a planetary mill and dried to obtain uniform inorganic oxide powder. Then, ethyl cellulose and polyvinyl butyral (a mass ratio of the two was 7:3) as an organic binder in an amount of 0.6% (mass percentage, the same below), polyamide as a thixotropic agent in an amount of 0.4%, organic silicone oil in an amount of 0.5%, tallow diamine dioleate as a surfactant in an amount of 0.3%, and butyl carbitol acetate and dimethyl adipate (a mass ratio of the two was 5:5) as an organic solvent in an amount of 6.4% were mixed, and stirred at 50-60° C. under a high shearing force for 1.5 hours. The inorganic oxide powder in an amount of 2.4% and silver powder in an amount of 89.4% were added to the above mixture, and a mixture was formed after sufficient stirring. The paste composition was repeatedly milled with a three-roll mill to form a conductive paste by milling.

Then the conductive paste was printed onto a silicon wafer substrate by a screen-printing technique. Cell sheets were dried in an infrared drying oven and then sintered at 750-850° C. in a belt type firing furnace. Cooling was performed after sintering, and cells were formed.

A viscosity change for 30 days and photoelectric conversion efficiency of the cell were measured according to the above-mentioned methods for measuring the viscosity and testing the photoelectric conversion efficiency of the cell, and results were shown in Table 1.

In comparison with a sample P1, it could be found that when a $SiO_2$ component was added into samples P2-P5, a water weight loss of the inorganic oxide and a viscosity change rate of the paste within 30 days could be significantly reduced, and the viscosity change rate decreased with an increase of a content of $SiO_2$, indicating that addition of $SiO_2$ helped to effectively reduce water on the surface of the inorganic oxide. However, when the content of $SiO_2$ was 16%, although the viscosity change rate of the conductive paste for 30 days was lower, the photoelectric conversion efficiency thereof was lowered to a certain extent compared with that obtained when the content of $SiO_2$ was 12%. Therefore, in order to take into account the viscosity change rate and the photoelectric conversion efficiency, the content of $SiO_2$ was preferentially 12%.

TABLE 1

Formula (in mol %) of the samples P1-P5 and performance test data thereof

| Samples | P1 | P2 | P3 | P4 | P5 |
|---|---|---|---|---|---|
| $TeO_2$ | 40% | 40% | 40% | 40% | 40% |
| $Li_2O$ | 20% | 20% | 20% | 20% | 20% |
| $SiO_2$ | 0% | 4% | 8% | 12% | 16% |
| $ZrO_2$ | — | — | — | — | — |
| PbO | 26% | 24% | 20% | 16% | 14% |
| $Bi_2O_3$ | 8% | 6% | 6% | 6% | 4% |
| MgO | 2% | 2% | 2% | 2% | 2% |
| CaO | 4% | 4% | 4% | 4% | 4% |
| Total | 100% | 100% | 100% | 100% | 100% |
| Water related weight loss of inorganic oxide | 2.23% | 1.69% | 1.52% | 1.39% | 1.35% |
| Viscosity change of paste for 30 days $|\Delta\eta|$ | 46% | 29% | 23% | 20% | 17% |
| Photoelectric conversion efficiency | 22.87% | 22.89% | 22.92% | 22.93% | 22.88% |

Example 2

Different metal oxides were mixed in a certain proportion according to a formula of Table 2. Preparation methods of a conductive paste and a solar cell were the same as those in Example 1, and test results were shown in Table 2.

Compared with the sample P1, the viscosity change of the finally obtained conductive paste for 30 days was significantly decreased when silicon oxide and zirconium oxide were added in samples P6-P10, and the viscosity change was reduced by 39%-74% compared with the sample P1. Meanwhile, the photoelectric conversion efficiency of the samples P6-P10 was significantly improved. In particular, the viscosity change of the sample P7 for 30 days was reduced by 73.9% and 40.0% compared with the samples P1 and P4, respectively, while the photoelectric conversion efficiency was maintained, that is, the sample P7 significantly improved the long-term storage stability of the conductive paste while maintaining the photoelectric conversion efficiency.

Through a large number of experiments, it could be found that when the frit contained, in mol %, includes 24%-40% $TeO_2$, 18%-24% $Li_2O$, 4%-13% $SiO_2$, 0-2% $ZrO_2$, and a balance $MO_x$ (where $MO_x$ is one or a mixture of $Na_2O$, $K_2O$, MgO, CaO, SrO, $TiO_2$, $V_2O_5$, $Cr_2O_3$, $MoO_3$, $WO_3$, MnO, CuO, $Ag_2O$, ZnO, CdO, $B_2O_3$, $Al_2O_3$, $Ga_2O_3$, $Tl_2O_3$, $GeO_2$, PbO, $P_2O_5$, and $Bi_2O_3$), the photoelectric conversion efficiency of the solar cell could be improved while significantly improving the long-term storage stability of the conductive paste. More preferentially, the frit included 28-40% $TeO_2$, 18-20% $Li_2O$, 12-13% $SiO_2$, 0.2-2% $ZrO_2$, and the balance $MO_x$, and the viscosity change rate of the obtained conductive paste for 30 days was less than 20%, the water weight loss of the inorganic oxide was less than 1.4%, and the photoelectric conversion efficiency was greater than 22.90%. The most preferential composition was the sample P7: 40% $TeO_2$, 20% $Li_2O$, 12% $SiO_2$, 2% $ZrO_2$, and 26% $MO_x$.

TABLE 2

Formula (in mol %) of samples P6-P10 and performance test data thereof

| Samples | P1 | P4 | P6 | P7 | P8 | P9 | P10 |
|---|---|---|---|---|---|---|---|
| $TeO_2$ | 40% | 40% | 40% | 40% | 28% | 24% | 36% |
| $Li_2O$ | 20% | 20% | 20% | 20% | 18% | 24% | 20% |
| $SiO_2$ | 0% | 12% | 12% | 12% | 13% | 8% | 4% |
| $ZrO_2$ | — | — | 0.2% | 2% | 0.5% | 1% | 1% |
| PbO | 26% | 16% | 15.8% | 15% | 29% | 31% | 27% |
| $Bi_2O_3$ | 8% | 6% | 6% | 5% | 6% | 6% | 6% |
| MgO | 2% | 2% | 2% | 2% | 2% | 2% | 2% |
| CaO | 4% | 4% | 4% | 4% | 4% | 4% | 4% |
| Total | 100% | 100% | 100% | 100% | 100% | 100% | 100% |
| Water related weight loss of inorganic oxide | 2.23% | 1.39% | 1.37% | 1.29% | 1.35% | 1.48% | 1.59% |
| Viscosity change of paste for 30 days $|\Delta\eta|$ | 46% | 20% | 16% | 12% | 18% | 24% | 28.0% |
| Photoelectric conversion efficiency | 22.87% | 22.93% | 22.93% | 22.91% | 22.91% | 22.94% | 22.90% |

Example 3

Different metal oxides were mixed in a certain proportion according to a formula of Table 3. Preparation methods of a conductive paste and a solar cell were the same as those in Example 1, and test results were shown in Table 3.

It could be found that compared with the sample P7, when the content of $ZrO_2$ in a sample P11 was too high, although the viscosity change of the conductive paste could be reduced, the photoelectric conversion efficiency thereof was significantly reduced compared with the sample P7 and lower than that in the sample P1. Compared with the sample P7, although a too low $Li_2O$ content and a too high $SiO_2$ content in a sample P12 could reduce the viscosity change of the conductive paste, the photoelectric conversion efficiency thereof was also significantly reduced compared with the sample P7. It could be found that only when the composition was within the range of Example 2, could the effects that the viscosity change of the conductive paste within 30 days was small and the photoelectric conversion efficiency was significantly improved be achieved.

TABLE 3

Formula (in mol %) of samples P11-P12 and performance test data thereof

| Samples | P11 | P12 |
|---|---|---|
| $TeO_2$ | 40% | 32% |
| $Li_2O$ | 20% | 10% |
| $SiO_2$ | 12% | 20.0% |
| $ZrO_2$ | 5% | 1.5% |
| PbO | 14% | 25% |
| $Bi_2O_3$ | 3% | 6% |
| MgO | 2% | 2% |
| CaO | 4% | 4% |
| Total | 100% | 100% |
| Water related weight loss of inorganic oxide | 1.19% | 1.27% |
| Viscosity change of paste for 30 days $|\Delta\eta|$ | 11% | 11% |
| Photoelectric conversion efficiency | 22.73% | 22.79% |

Although the present disclosure is disclosed as above in preferred examples, the examples are not intended to limit the present disclosure. Anyone skilled in the art can make various changes and modifications without departing from the spirit and scope of the present disclosure. Therefore, the protection scope of the present disclosure should be defined by the claims.

What is claimed is:

1. A mixture comprising, in mol % 40% $TeO_2$, 20% $Li_2O$, 12% $SiO_2$, 2% $ZrO_2$, and 26% $MO_x$, where $MO_x$ is one or a mixture of $Na_2O$, $K_2O$, MgO, CaO, SrO, $TiO_2$, $V_2O_5$, $Cr_2O_3$, $MoO_3$, $WO_3$, MnO, CuO, $Ag_2O$, ZnO, CdO, $B_2O_3$, $Al_2O_3$, $Ga_2O_3$, $Tl_2O_3$, $GeO_2$, PbO, $P_2O_5$, and $Bi_2O_3$.

2. The mixture where $MO_x$ is, in mol % 15% PbO 5% $Bi_2O_3$, 2% MgO, and 4% CaO.

3. A mixture comprising, in mol %, 40% $TeO_2$, 20% $Li_2O$, 12% $SiO_2$, 5% $ZrO_2$, 14% PbO, 3% $Bi_2O_3$, 2% MgO, 4% CaO.

* * * * *